(12) United States Patent
Hara

(10) Patent No.: US 6,429,147 B2
(45) Date of Patent: *Aug. 6, 2002

(54) METHOD FOR MAKING AN INSULATING FILM

(75) Inventor: Masaki Hara, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,007

(22) Filed: Jun. 29, 1998

(30) Foreign Application Priority Data

Jun. 30, 1997 (JP) .............................. 9-173810

(51) Int. Cl.[7] .............................. H01L 21/31
(52) U.S. Cl. .................. 438/763; 438/760; 438/761; 438/787; 438/788; 438/624
(58) Field of Search ............... 438/763, 787, 438/788, 624, 760, 761, 784; 148/DIG. 118, DIG. 81; 257/646

(56) References Cited

U.S. PATENT DOCUMENTS

| | | | | |
|---|---|---|---|---|
| 4,764,248 A | * | 8/1988 | Bhattacherjee et al. | 438/439 |
| 5,286,681 A | * | 2/1994 | Maeda et al. | 438/763 |
| 5,314,724 A | * | 5/1994 | Tsukume et al. | 438/489 |
| 5,376,591 A | * | 12/1994 | Maeda et al. | 148/DIG. 118 |
| 5,506,177 A | * | 4/1996 | Kishimoto et al. | 438/624 |
| 5,610,105 A | * | 3/1997 | Vines et al. | 438/789 |
| 5,683,940 A | * | 11/1997 | Yahiro | 438/763 |
| 5,691,247 A | * | 11/1997 | Lewis et al. | 438/763 |
| 5,874,367 A | * | 2/1999 | Dobson | 438/788 |
| 5,888,909 A | * | 3/1999 | Hara | 438/778 |
| 5,891,800 A | * | 4/1999 | Ben-Guigui et al. | 438/631 |
| 6,048,801 A | * | 4/2000 | Hara | 438/76 |

* cited by examiner

Primary Examiner—Carl Whitehead, Jr.
Assistant Examiner—Maria Guerrero
(74) Attorney, Agent, or Firm—Sonnenschein, Nath & Rosenthal

(57) ABSTRACT

In a method for manufacturing an insulating film using a fluid source material without inviting corrosion of metal wiring or the problem of poisoned via, after making a $SiO_2$ film as a base layer on an Si substrate defining an uneven surface with an Al alloy wiring by plasma CVD using $SiH_4$ and $N_2O$, and further making an inter-layer insualting film having a fluidity on the $SiO_2$ film by low pressure CVD using $SiH_4$ or organosilane and $H_2O_2$, $O_2$ plasma processing is applied to the inter-layer insulating film. After that, a $SiO_2$ film as a cap layer is made on the inter-layer insulating film by plasma CVD using $SiH_4$ and $N_2O$. Rapid thermal annealing using lamp heating or $O_3$ annealing may be done in lieu of $O_2$ plasma processing.

11 Claims, 4 Drawing Sheets

METHOD FOR MAKING AN INSULATING FILM

BACKGROUND OF THE INVENTION

1. Field of the Invention

This invention relates to a method for making an insulating film particularly suitable for use in making an inter-layer insulating film in a semiconductor device.

2. Description of the Related Art

In a process of manufacturing a semiconductor device, a method for making an inter-layer insulating film using a fluid source material is often used to level the surface of a substrate by smoothing unevenness made by wiring or the like. Such an inter-layer insulating film contains much moisture ($H_2O$) and is highly fluid.

In conventional techniques, a non-fluid cap layer was formed directly on a fluid inter-layer insulating film containing much $H_2O$ by plasma CVD (for example, 1995 Dry Process Symposium, pp.261–268) to prevent cracks in the fluid inter-layer insulating film containing $H_2O$ during post-annealing. Typically used as the cap layer was a $SiO_2$ film made of $SiH_4$ and $N_2O$ by plasma CVD because $N_2O$ was more preferable than $O_2$ as the source material of oxygen in reducing the number of particles produced during the process.

However, the $SiO_2$ cap layer made of $SiH_4$ and $N_2O$ by plasma CVD invited corrosion of the metal wiring and created so-called poisoned via (a kind of defects of via holes (connection holes) formed in the inter-layer insulating films), among others.

OBJECT AND SUMMARY OF THE INVENTION

It is therefore an object of the invention to provide a method for making an insulating film free from problems such as corrosion of metal wiring and poisoned via even when a fluid source material is used to make the insulating film.

The Inventor made researches to overcome the above-mentioned problems involved in the conventional techniques as summarized below.

The Inventor has found through various experiments that $NH_3$ is produced in vapor by plasma in the process of making a $SiO_2$ film by plasma CVD using $SiH_4$ and $N_2O$ as source materials. Under the condition, if the inter-layer insulating film underlying the $SiO_2$ film contains $H_2O$ and has a fluidity, then $NH_3$ produced in the vapor is incorporated (absorbed) into the underlying inter-layer insulating film. $NH_3$ incorporated into the underlying inter-layer insulating film is released from the film when the inter-layer insulating film is heated or etched in a later process, and probably cause the problems of corrosion of metal wiring and the poisoned via.

Therefore, in order to prevent these problems, it is important to take measures to prevent the $NH_3$ which is produced in the vapor in the process of making the $SiO_2$ film by plasma CVD using $SiH_4$ and $N_2O$ as the source materials from being incorporated in the underlying inter-layer insulating film. For this purpose, it is effective to remove $H_2O$ from the surface of the underlying inter-layer insulating film and to cure the surface prior to the process of making the $SiO_2$ film. The present invention has been made through these researches by the Inventor.

According to a first aspect of the invention, there is provided a method for making an insulating film configured to form the insulating film on a substrate having an uneven surface by using a fluid source material so as to level the unevenness, comprising the steps of:

forming a first insulating film having a fluidity on the substrate by using a fluid source material;

applying plasma processing onto the first insulating film; and forming a second insulating not having a fluidity on the first insulating film after the plasma processing.

According to a second aspect of the invention, there is provided a method for making an insulating film configured to form the insulating film on a substrate having an uneven surface by using a fluid source material so as to level the unevenness, comprising the steps of:

forming a first insulating film having a fluidity on the substrate by using a fluid source material;

applying rapid thermal annealing by lamp heating onto the first insulating film; and forming a second insulating not having a fluidity on the first insulating film after the rapid thermal annealing.

According to a third aspect of the invention, there is provided a method for making an insulating film configured to form the insulating film on a substrate having an uneven surface by using a fluid source material so as to level the unevenness, comprising the steps of:

forming a first insulating film having a fluidity on the substrate by using a fluid source material;

applying ozone processing onto the first insulating film; and forming a second insulating not having a fluidity on the first insulating film after the ozone processing.

In the first aspect of the invention, the step of annealing the structure may be added after making the first insulating film and prior to plasma processing to previously cure the entirety of the first insulating film to a certain extent in order to ensure that the first insulating film be more effectively cured by subsequent plasma processing. The annealing temperature is not higher than 500° C., and is about 350° C., for example, when Al alloy wiring is used. The annealing may be done either under a vacuum or atmospheric pressure, but can be done more conveniently within a chamber used for the plasma processing. For plasma processing, it is preferable to use a gas of molecules, such as $O_2$ gas, containing oxygen as its matrix atoms and not containing nitrogen as its matrix atoms.

In the present invention, the first insulating film having a fluidity is typically made by low pressure CVD using $SiH_4$ or organosilane and $H_2O_2$ as the source materials.

According to the invention, having the above-summarized construction configured to execute plasma processing, rapid thermal annealing by using lamp heating or ozone processing after making a first insulating film having a fluidity, $H_2O$ can be removed from the surface of the first insulating film due to dehydrated condensation, and the film can be hardened. Therefore, even when $NH_3$ is produced in the vapor by plasma while a $SiO_2$ film is stacked on the first insulating film by plasma CVD using $SiH_4$ and $N_2O$ as the source material gases, $NH_3$ can be prevented from being incorporated into the first insulating film. As a result, corrosion of metal wiring or the problem of poisoned via can be prevented.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1A:
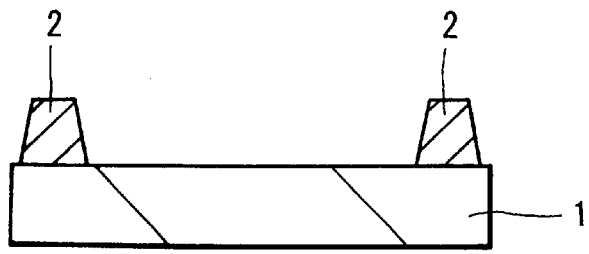
FIGS. 1A through 1E are cross-sectional views for explaining a method for making an inter-layer insulating film according to the first embodiment of the invention.

Explained below are embodiments of the invention with reference to the drawings. In all figures illustrating the embodiments of the invention, the same or equivalent elements are labeled with common reference numerals.

FIGS. 1A through 1E show the method for making an inter-layer insulating film according to the first embodiment of the invention.

In the embodiment shown here, an Al alloy wiring 2 is formed on a Si substrate 1 having formed a device and covered with an inter-layer insulating film previously as shown in FIG. 1A.

Figure 1B:
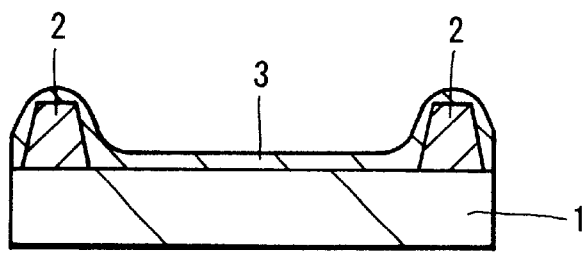

Next, as shown in FIG. 1B, a non-fluid $SiO_2$ film 3 is formed as a base layer on the Si substrate 1 by plasma CVD using $SiH_4$ and $N_2O$, for example, as the source materials.

Figure 1C:
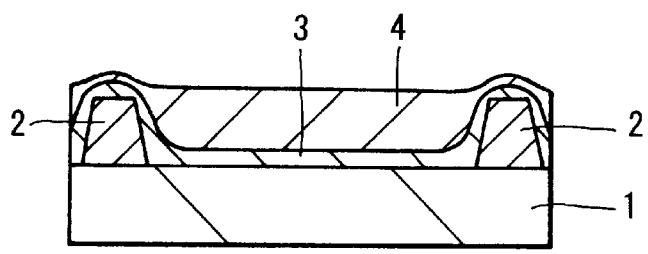

Next, as shown in FIG. 1C, a fluid inter-layer insulating film 4 is formed by low pressure CVD using monomethyl silane ($Si(CH_3)H_3$) and $H_2O_2$, for example, as the source materials. The fluid inter-layer insulating film 4 contains silanol polymer as its major component, and contains much $H_2O$ in the film (1995 Dry Process Symposium, pp. 261–268).

Figure 1D:
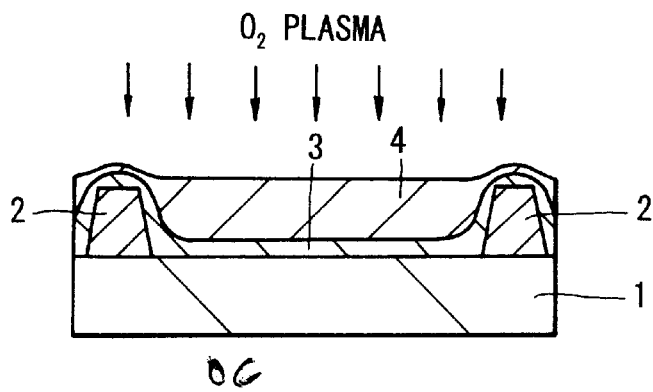

Next, as shown in FIG. 1D, the surface of the fluid inter-layer insulating film 4 is processed with $O_2$ plasma to cure the surface of the inter-layer insulating film 4. The $O_2$ plasma processing promotes hydrated condensation of silanol ($Si(OH)_4$) along the surface of the inter-layer insulating film 4, and changes the surface of the inter-layer insulating film 4 to be substantially free from $H_2O$.

Figure 1E:
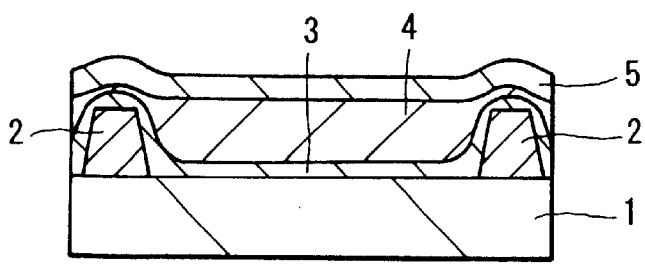

Next, as shown in FIG. 1E, a non-fluid $SiO_2$ film 5 is formed as a cap layer on the inter-layer insulating film 4 by plasma CVD using $SiH_4$ and $N_2O$, for example, as the source materials. Since substantially no $H_2O$ is contained in the surface of the inter-layer insulating film 4, $NH_3$ produced in the vapor by the plasma is not incorporated into the inter-layer insulating film 4 in the process of stacking the $SiO_2$ film 5 as the cap layer.

After that, the inter-layer insulating film 4 is cured by post-annealing.

As a result, an inter-layer insulating film of a triple-layered structure of the inter-layer insulating film 4, underlying $SiO_2$ film 3 as the base layer and overlying $SiO_2$ film 5 as the cap layer is obtained.

EXAMPLE

As shown in FIG. 1A, an Al alloy wiring 1, which is 0.65 µm height and 0.4 µm wide, is made on the Si substrate 1.

Next, as shown in FIG. 1B, a $SiO_2$ film 3 of the thickness of 0.1 µm is formed as a base layer by plasma CVD, using $N_2O$, $SiH_4$ and $N_2$, setting their flow rates to 3000 SCCM, 120 SCCM and 1000 SCCM, respectively, under the reaction pressure of 1.2 Torr (1200 mTorr), and setting the substrate temperature to 350° C.

Next, as shown in FIG. 1C, a fluid inter-layer insulating film 4 of the thickness of 0.8 µm is formed by low pressure CVD, using $Si(CH_3)H_3$ and vapor phase $H_2O_2$ and $N_2$, setting their flow rates to 100 SCCM, 0.7 g/min and 500 SCCM, respectively, under the reaction pressure of 1 Torr, and setting the substrate temperature to 0° C.

Next, as shown in FIG. 1D, heating the Si substrate to 350° C., using a mixed gas of $O_2$ and Ar, generating $O_2$ plasma under the pressure of 1.2 Torr and the RF power of 500 W, $O_2$ plasma processing of the inter-layer insulating film 4 is executed for three minutes. The flow rate of $O_2$ is set to 2000 SCCM, and the flow rate of Ar is set to 1000 SCCM. The $O_2$ plasma processing resulted in curing the surface of the inter-layer insulating film 4 and in removing $H_2O$ from the surface portion.

Next, as shown in FIG. 1E, a $SiO_2$ film 5 as a cap layer is stacked to the thickness of 0.3 µm by plasma CVD, using $N_2O$, $SiH_4$ and $N_2$, setting their flow rates to 2500 SCCM, 120 SCCM and 1000 SCCM, the reaction pressure to 0.8 Torr (800 mTorr), and the substrate temperature to 350° C.

After that, the product is post-annealed for 30 minutes in a $N_2$ atmosphere to cure the inter-layer insulating film 4.

The inter-layer insulating film having a triple-layered structure, thus obtained, did not contain a detrimental amount of residual gas ($NH_3$ gas, or the like) which might cause a problem in the process and exhibited good characteristics.

Figure 2A:
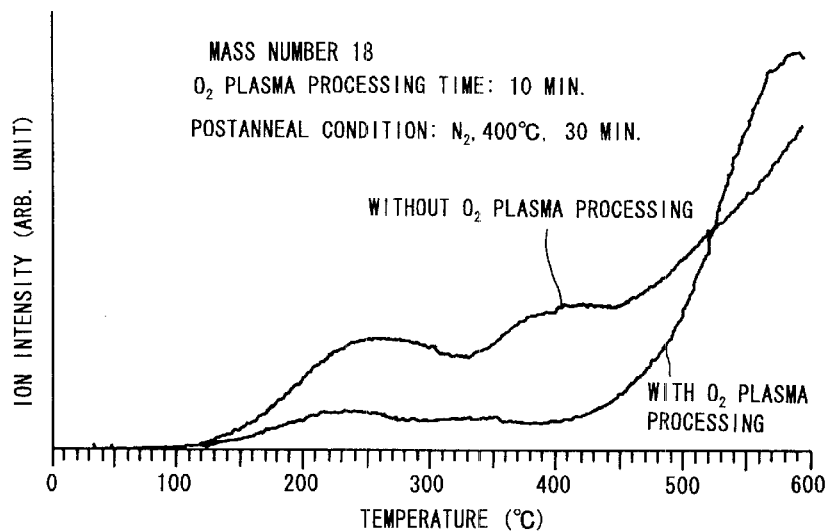
FIGS. 2A through 2C are schematic diagrams for explaining effects of $O_2$ plasma processing executed in the method for making the inter-layer insulating film according to the first embodiment of the invention.
Figure 2B:
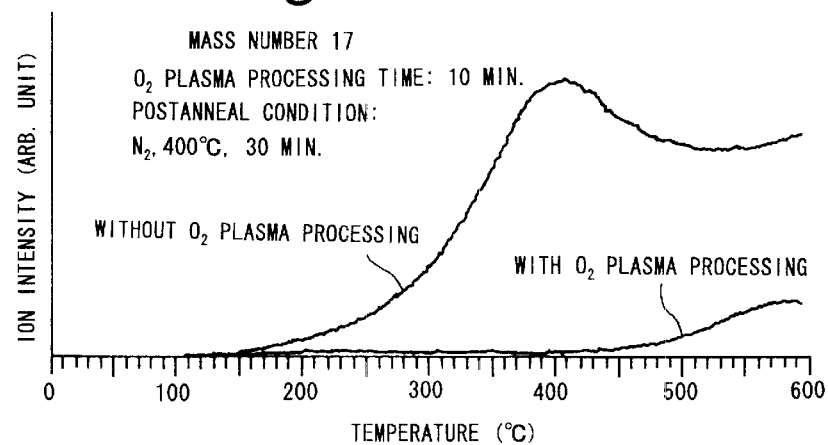
Figure 2C:
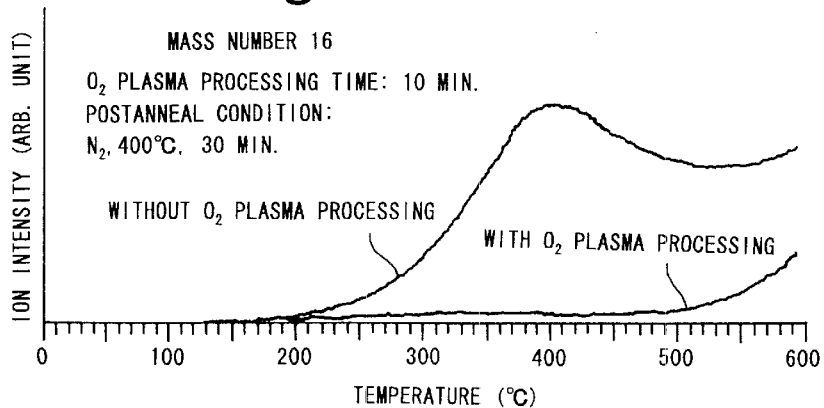

Here is shown evidential data on the effects obtained by $O_2$ plasma processing of the fluid inter-layer insulating film 4. FIGS. 2A through 2C show values by TDS (Thermal Desorption Spectroscopy) measurement on samples treated and not treated by $O_2$ plasma processing after making the fluid inter-layer insulating film 4 by low pressure CVD. Both samples were prepared by making the $SiO_2$ film 5 after $O_2$ plasma processing and by thereafter post-annealing for 30 minutes in a $N_2$ atmosphere at 400° C., and were measured by TDS measurement. For $O_2$ plasma processing, the flow rate of $O_2$ was set to 800 SCCM, the pressure to 250 mTorr, RF power to 500 W, substrate temperature to 0° C., and processing time to 10 minutes. FIGS. 2A, 2B and 2C are data upon the mass number of ions to be measured being 18 (corresponding to $H_2O$), 17 (corresponding to $NH_3$ and OH) and 16 (corresponding to $NH_2$ and O), respectively.

Comparing FIGS. 2A and 2B, as to samples without $O_2$ plasma processing, the ratio of the ionic strength of the mass number 18 relative to the ionic strength of the mass number 17 is much larger than the value when $H_2O$ alone exists as a kind of gas, and this strongly indicates that another kind of gas with the mass number 17, $NH_3$, exists. In contrast, as to samples treated by without $O_2$ plasma processing, the ratio of the ionic strength of the mass number 17 relative to the ionic intensity of the mass number 18 is nearer to the value when $H_2O$ alone exists as a kind of gas.

These phenomena indicate that, during the process of making the $SiO_2$ film 3 by plasma CVD, substantially no $NH_3$ produced in the vapor by the plasma is not incorporated into the inter-layer insulating film 4. This means that $O_2$ plasma processing effectively removes $H_2O$ from the surface of the fluid inter-layer insulating film 4.

As explained above, according to the first embodiment, substantially all $H_2O$ can be removed from the surface of the inter-layer insulating film 4 by treating the inter-layer insulating film 4 by $O_2$ plasma processing after making the inter-layer insulating film 4 as a fluid film. Therefore, even when the $SiO_2$ film 5 is made as a cap layer directly on the inter-layer insulating film 4 by plasma CVD, $NH_3$ produced in the vapor by the plasma during the process is never incorporated into the inter-layer insulating film 4. As a result, corrosion of the Al alloy wiring 2 or the problem of poisoned via do not occur.

FIGS. 3A through 3E show a method for making an inter-layer insulating film according to the second embodiment of the invention.

Figure 3A:
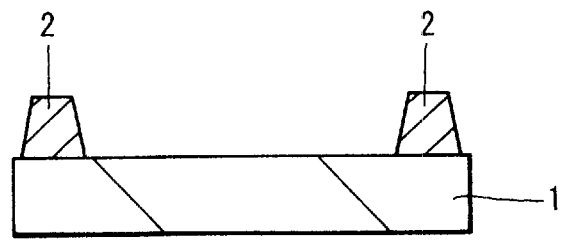
FIGS. 3A through 3E are cross-sectional views for explaining a method for making an inter-layer insulating film according to the second embodiment of the invention.

In the embodiment shown here, the Al alloy wiring 2 is formed on the Si substrate 1 having formed a device and covered with an inter-layer insulating film previously as shown in FIG. 3A,.

Figure 3B:
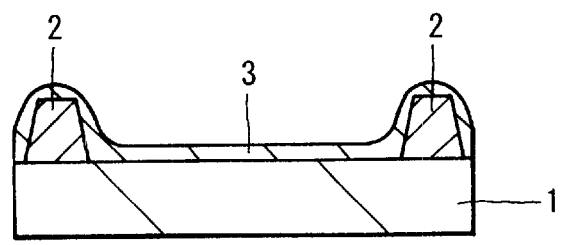

Next, as shown in FIG. 3B, a non-fluid $SiO_2$ film 3 is made as a base layer on the Si substrate 1 by plasma CVD using $SiH_4$ and $N_2O$, for example, as the source materials.

Figure 3C:
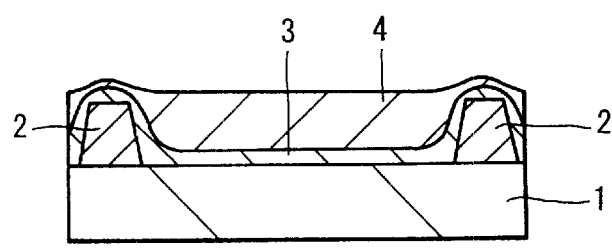

Next, as shown in FIG. 3C, a fluid inter-layer insulating film 4 is made by low pressure CVD using $Si(CH_3)H_3$ and $H_2O_2$, for example, as the source materials. The steps heretofore are the same as those of the first embodiment.

Figure 3D:
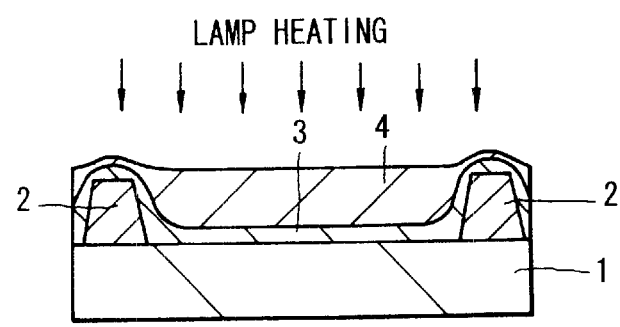

Next, as shown in FIG. 3D, the surface of the inter-layer insulating film 4 is heated by lamp heating, namely by using radiant heat from a lamp heater, to cure the surface of the inter-layer insulating film 4 by rapid thermal annealing in a short time. By the rapid thermal annealing, dehydrated condensation of $Si(OH)_4$ is promoted along the surface of the inter-layer insulating film 4, and the surface of the inter-layer insulating film 4 is changed to be substantially free from $H_2O$.

Figure 3E:
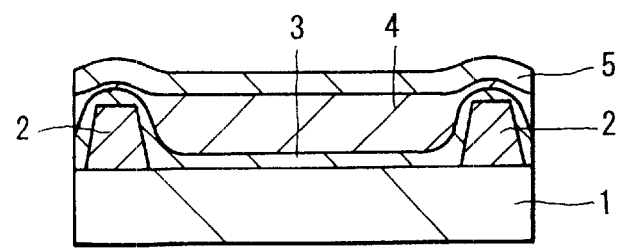

Next, as shown in FIG. 3E, a non-fluid $SiO_2$ film 5 is made as a cap layer on the inter-layer insulating film 4 by plasma CVD using $SiH_4$ and $N_2O$, for example, as the source materials. In this case, since the surface of the inter-layer insulating film 4 contains substantially no $H_2O$, it does not incorporate $NH_3$ produced in the vapor by the plasma during the process of making the $SiO_2$ film 5 as the cap layer.

After that, the inter-layer insulating film 4 is cured by post-annealing.

By the process explained above, the inter-layer insulating film of a triple-layered structure of the inter-layer insulating film 4, underlying $SiO_2$ film 3 as the base layer and overlying $SiO_2$ film 5 as the cap layer is obtained.

EXAMPLE

As shown in FIG. 3A, an Al alloy wiring 1, which is 0.65 $\mu$m height and 0.4 $\mu$m wide, is made on the Si substrate 1.

Next, as shown in FIG. 3B, a $SiO_2$ film 3 of the thickness of a 0.1 $\mu$m is formed as a base layer by plasma CVD, using $N_2O$, $SiH_4$ and $N_2$, setting their flow rates to 3000 SCCM, 120 SCCM and 1000 SCCM, respectively, under the reaction pressure of 1.2 Torr (1200 mTorr), setting the substrate temperature to 350° C.

Next, as shown in FIG. 3C, an inter-layer insulating film 4 of the thickness of 0.8 $\mu$m is formed by low pressure CVD, using $Si(CH_3)H_3$ and vapor phase $H_2O_2$ and $N_2$, setting their flow rates to 100 SCCM, 0.7 g/min and 500 SCCM, respectively, under the reaction pressure of 1 Torr, and setting the substrate temperature to 0° C.

Next, as shown in FIG. 3D, heating the Si substrate to 350° C. under vacuum, rapid thermal annealing by lamp heating is executed for 60 seconds. At that time, the surface temperature of the Si substrate 1 was about 500° C. By rapid thermal annealing using lamp heating, the surface of the interlayer insulating film 4 is cured, and the surface portion was changed to be free from $H_2O$.

Next, as shown in FIG. 3E, a $SiO_2$ film 5 as a cap layer is stacked to the thickness of 0.3 $\mu$m by plasma CVD, using $N_2O$, $SiH_4$ and $N_2$, setting their flow rates to 2500 SCCM, 120 SCCM and 1000 SCCM, the reaction pressure to 0.8 Torr (800 mTorr), and the substrate temperature to 350° C.

After that, the product is post-annealed for 30 minutes in a $N_2$ atmosphere to cure the inter-layer insulating film 4.

The inter-layer insulating film having a triple-layered structure, thus obtained, did not contain a detrimental amount of residual gas ($NH_3$ gas, or the like) which might cause a problem in the process and exhibited good characteristics.

As explained above, according to the second embodiment, substantially all $H_2O$ can be removed from the surface of the inter-layer insulating film 4 by treating the surface of the inter-layer insulating film 4 by rapid thermal annealing by lamp heating after making the inter-layer insulating film 4 as a fluid film. Therefore, in the same manner as the first embodiment, even when the $SiO_2$ film 5 is made as a cap layer directly on the inter-layer insulating film 4 by plasma CVD, $NH_3$ produced in the vapor by the plasma during the process is never incorporated into the inter-layer insulating film 4. As a result, corrosion of the Al alloy wiring 2 or the problem of poisoned via do not occur.

FIGS. 4A through 4E show a method for making an inter-layer insulating film according to the third embodiment of the invention.

Figure 4A:
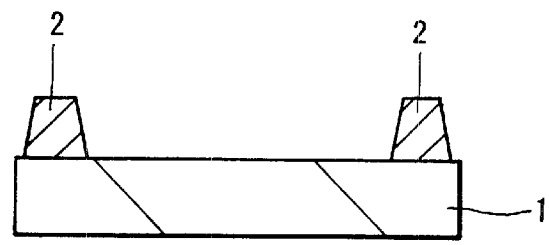
FIGS. 4A through 4E are cross-sectional views for explaining a method for making an inter-layer insulating film according to the third embodiment of the invention.

In the embodiment shown here, the Al alloy wiring 2 is formed on the Si substrate 1 having formed a device and covered with an inter-layer insulating film previously as shown in FIG. 4A.

Figure 4B:
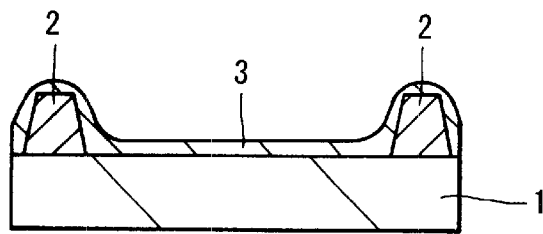

Next, as shown in FIG. 4B, a non-fluid $SiO_2$ film 3 is made as a base layer on the Si substrate 1 by plasma CVD using $SiH_4$ and $N_2O$, for example, as the source materials.

Figure 4C:
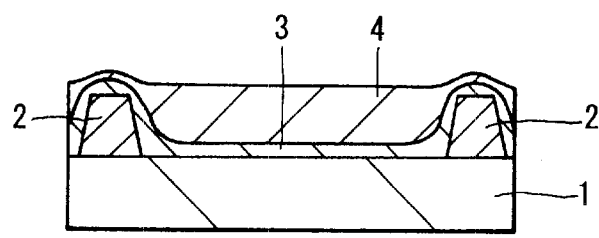

Next, as shown in FIG. 4C, a fluid inter-layer insulating film 4 is made by low pressure CVD using $Si(CH_3)H_3$ and $H_2O_2$, for example, as the source materials. The steps heretofore are the same as those of the first embodiment.

Figure 4D:
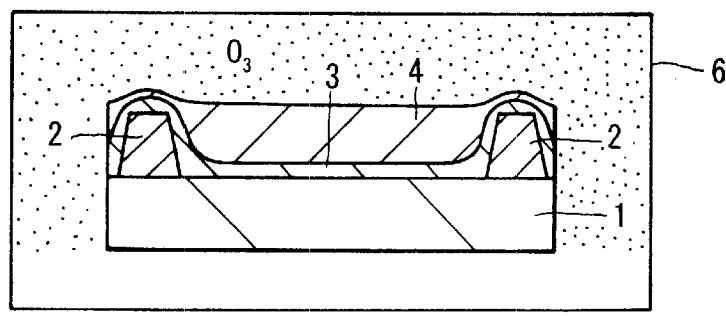

Next, as shown in FIG. 4D, the Si substrate 1 is set in a chamber 6 and heated while introducing $O_3$ into the chamber to cure the surface of the inter-layer insulating film 4 by $O_3$ annealing of the inter-layer insulating film 4. By the $O_3$ annealing, dehydrated condensation of $Si(OH)_4$ is promoted along the surface of the inter-layer insulating film 4, and the surface of the inter-layer insulating film 4 is changed to be substantially free from $H_2O$.

Figure 4E:
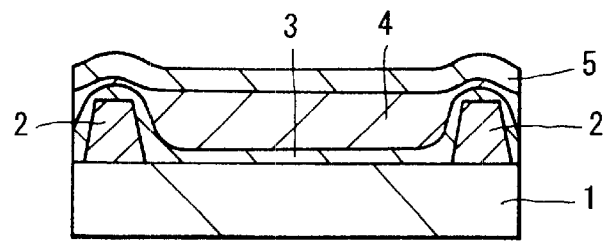

Next, as shown in FIG. 4E, a non-fluid $SiO_2$ film 5 is made as a cap layer on the inter-layer insulating film 4 by plasma CVD using $SiH_4$ and $N_2O$, for example, as the source materials. In this case, since the surface of the inter-layer insulating film 4 contains substantially no $H_2O$, it does not incorporate $NH_3$ produced in the vapor by the plasma during the process of making the $SiO_2$ film 5 as the cap layer.

After that, the inter-layer insulating film 4 is cured by post-annealing.

By the process explained above, the inter-layer insulating film of a triple-layered structure of the inter-layer insulating film 4, underlying $SiO_2$ film 3 as the base layer and overlying $SiO_2$ film 5 as the cap layer is obtained.

EXAMPLE

As shown in FIG. 4A, an Al alloy wiring 1, which is 0.65 $\mu$m height and 0.4 $\mu$m wide, is made on the Si substrate 1.

Next, as shown in FIG. 4B, a $SiO_2$ film 3 of the thickness of 0.1 μm is formed as a base layer by plasma CVD, using $N_2O$, $SiH_4$ and $N_2$, setting their flow rates to 3000 SCCM, 120 SCCM and 1000 SCCM, respectively, under the reaction pressure of 1.2 Torr (1200 mTorr), and setting the substrate temperature to 350° C.

Next, as shown in FIG. 4C, a fluid inter-layer insulating film 4 of the thickness of 0.8 μm is formed by low pressure CVD, using $Si(CH_3)H_3$ and vapor phase $H_2O_2$ and $N_2$, setting their flow rates to 100 SCCM, 0.7 g/min and 500 SCCM, respectively, under the reaction pressure of 1 Torr, and setting the substrate temperature to 0° C.

Next, as shown in FIG. 4D, using a mixed gas of $O_2$ and He, setting their flow rates to 2 SLM and 500 SCCM, a gas containing $O_3$ by the concentration of 10 wt % is generated within the chamber 6, and the pressure of the gas containing $O_3$ is held in 650 Torr. Under the condition, the Si substrate is heated to 400° C. and undergoes $O_3$ annealing for three minutes. As a result of $O_3$ annealing conducted here, the surface of the inter-layer insulating film 4 is cured, and the surface portion was changed to be free from $H_2O$.

Next, as shown in FIG. 4E, a $SiO_2$ film 5 as a cap layer is stacked to the thickness of 0.3 μm by plasma CVD, using $N_2O$, $SiH_4$ and $N_2$, setting their flow rates to 2500 SCCM, 120 SCCM and 1000 SCCM, the reaction pressure to 0.8 Torr (800 mTorr), and the substrate temperature to 350° C.

After that, the product is post-annealed for 30 minutes in a $N_2$ atmosphere to cure the inter-layer insulating film 4.

The inter-layer insulating film having a triple-layered structure, thus obtained, did not contain a detrimental amount of residual gas ($NH_3$ gas, or the like) which might cause a problem in the process and exhibited good characteristics.

As explained above, according to the third embodiment, substantially all $H_2O$ can be removed from the surface of the inter-layer insulating film 4 by treating the surface of the inter-layer insulating film 4 by $O_3$ annealing after making the inter-layer insulating film 4 as a fluid film. Therefore, in the same manner as the first embodiment, even when the $SiO_2$ film 5 is made as a cap layer directly on the inter-layer insulating film 4 by plasma CVD, $NH_3$ produced in the vapor by the plasma during the process is never incorporated into the inter-layer insulating film 4. As a result, corrosion of the Al alloy wiring 2 or the problem of poisoned via do not occur.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerals, structures, gases, sorts of films, processes, wiring materials, substrate materials, and so forth, are only examples, and can be changed appropriately. Namely, although the first to third embodiments have been explained as using an organic source material, $Si(CH_3)H_3$, as the source material of Si in the process of making the inter-layer insulating film 4, any other source material of Si, such as $Si(CH_3)_2H_2$, $Si(CH_3)_3H$, $Si(CH_3)_4$, or the like, may be used where appropriate.

What is claimed is:

1. A method for making an insulating film configured to form on a substrate having an uneven surface by using a fluid source material, said method comprising:

providing a substrate having a surface with wiring attached thereto;

providing a film containing at least one fluid-inter-layer free of detrimental gases on the surface of the substrate to prevent corrosion by the steps of applying the fluid inter-layer having moisture by forming a first insulating film having fluidity on said surface of the substrate by using the fluid source material;

applying plasma processing onto said first insulating film with the substrate heated to 350° C. to remove moisture from the first insulating film, the plasma processing comprises a gas having matrix atoms free of nitrogen, the matrix atoms containing oxygen; and forming a cap layer by forming a second insulating film free of fluidity on said first insulating film after said plasma processing by a plasma CVD using $N_2O$, $SiH_4$ and $N_2$ at a substrate temperature of 350° C. wherein $NH_3$ produced by the plasma processing is not absorbed into the first insulating layer since moisture is removed from the first insulating layer which prevents corrosion of the wiring.

2. The method for making an insulating film according to claim 1 further comprising the step of annealing after the step of forming the first insulating film before the step of applying the plasma processing.

3. A method according to claim 1, wherein said first insulation film is formed by a low pressure CVD using $H_2O_2$ and a material selected from $SiH_4$ and organosilane as the source materials.

4. A method according to claim 1, wherein the detrimental gases are $NH_3$.

5. A method according to claim 1, wherein the step of providing the substrate includes forming a base layer of $SiO_2$ on the surface of the substrate.

6. A method for making an insulating film configured to form on a substrate having an uneven surface by using a fluid source material, said method comprising:

providing a substrate;

providing on the substrate a film containing at least one fluid inter-layer free of detrimental gases to prevent corrosion by the steps of applying the inter-layer having moisture by forming a first insulating film having fluidity on said substrate by using the fluid source material, the first insulating film being formed by a low pressure CVD using $H_2O_2$ and a material selected from $SiH_4$ and organosilane as the source material;

applying rapid thermal annealing by lamp heating onto said first insulating film to remove moisture from the first insulating film; and forming a cap layer by forming a second insulating film free of fluidity on said first insulating film after said rapid thermal annealing by a plasma CVD using $N_2O$, $SiH_4$ and $N_2$ at a substrate temperature of 350° C. wherein $NH_3$ produced by the plasma is not absorbed into the first insulating layer since moisture is removed from the first insulating layer which prevents corrosion of the wiring.

7. A method according to claim 6, wherein the detrimental gas is $NH_3$.

8. A method according to claim 6, wherein the step of providing the substrate includes forming a base layer of $SiO_2$ on the surface of the substrate.

9. A method for making an insulating film configured on a substrate having an uneven surface by using a fluid source material, said method comprising:

providing a substrate;

providing a film on the substrate, said film containing at least one fluid inter-layer free of detrimental gases to prevent corrosion by the steps of forming the inter-layer having moisture by forming a first insulating film having fluidity on said substrate by using the fluid source material, the first insulating film being formed by a low pressure CVD using $H_2O_2$ and a material selected from $SiH_4$ and organosilane as the source materials;

applying ozone processing onto said first insulating film with the substrate heated to 400° C. to remove moisture from the first insulating film; and forming a cap layer by forming a second insulting film free of fluidity on said first insulating film after said ozonization by a plasma CVD process using $N_2$, $N_2O$, $SiH_4$ with the substrate heated to a temperature of 350° C. wherein $NH_3$ produced by the plasma process is not absorbed into the first insulating layer since moisture is removed from the first insulating layer prevents corrosion of the wiring.

10. A method according to claim 9, wherein the detrimental gas is $NH_3$.

11. A method according to claim 9, wherein the step of providing the substrate includes forming a base layer of $SiO_2$ on the surface of the substrate.

* * * * *